(12) United States Patent
Yang et al.

(10) Patent No.: US 9,239,902 B2
(45) Date of Patent: *Jan. 19, 2016

(54) METHOD OF PREPARING A LAYOUT AND SYSTEM FOR PERFORMING THE SAME

(71) Applicant: TAIWAN SEMICONDUCTOR MANUFACTURING COMPANY, LTD., Hsinchu (TW)

(72) Inventors: Chen-Lin Yang, Zhubei (TW); Wei Min Chan, Sindian (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/625,959

(22) Filed: Feb. 19, 2015

(65) Prior Publication Data

US 2015/0161325 A1 Jun. 11, 2015

Related U.S. Application Data

(63) Continuation of application No. 12/913,949, filed on Oct. 28, 2010, now Pat. No. 8,990,751.

(51) Int. Cl.
*G06F 17/50* (2006.01)

(52) U.S. Cl.
CPC ........ *G06F 17/5081* (2013.01); *G06F 17/5009* (2013.01); *G06F 17/5068* (2013.01)

(58) Field of Classification Search
CPC ............ G06F 17/5036; G06F 17/5045; G06F 17/5068; G06F 17/5077; G06F 17/5081; G06F 2217/12; G06F 2217/78; G01R 31/31704; G01R 31/31706; Y10S 438/927
See application file for complete search history.

(56) References Cited

U.S. PATENT DOCUMENTS

| 7,784,010 | B1 | 8/2010 | Balsdon et al. |
| 2006/0080630 | A1 | 4/2006 | Lin |
| 2008/0116861 | A1 | 5/2008 | Kernahan et al. |
| 2009/0012747 | A1 | 1/2009 | Lee et al. |
| 2009/0144691 | A1 | 6/2009 | Rathsack et al. |

*Primary Examiner* — Vuthe Siek
*Assistant Examiner* — Aric Lin
(74) *Attorney, Agent, or Firm* — Hauptman Ham, LLP

(57) ABSTRACT

A method of preparing a layout for manufacturing an integrated circuit chip according to a circuit design, the method includes generating a pattern for the layout based on the circuit design, determining, by a processor, if at least one layout rule is violated by including the generated pattern in the layout and modifying the layout if the at least one layout rule is violated. The at least one layout rule includes a constraint on a relationship between a power line pattern and a device pattern in the layout. The at least one layout rule is specified by comparing a predetermined threshold value with one of an estimated voltage drop along a signal path in a second layout different than the layout or an estimated current density on the signal path in the second layout. The constraint includes a minimum number of contacts per device or power vias per device.

20 Claims, 9 Drawing Sheets

METHOD OF PREPARING A LAYOUT AND SYSTEM FOR PERFORMING THE SAME

PRIORITY CLAIM

The present application is a continuation of U.S. application Ser. No. 12/913,949, filed Oct. 28, 2010, which is incorporated herein by reference in its entirety.

BACKGROUND

Since the invention of integrated circuits (ICs), the semiconductor industry has experienced continual rapid growth due to continuous improvements in the integration density of various components (e.g. transistors, diodes, resistors, capacitors, etc.). A significant part of the improvement in integration density comes from repeated reductions in minimum feature size that allow the integration of more components into a given area.

Meanwhile, as semiconductor device features are reduced further, the impacts caused by current-resistance voltage drop (IR drop) effects and electro-migration (EM) effects increase. The IR drop effects refer to the voltage drops along electrical paths resulting from the currents carried by the electrical paths and the resistances of the electrical paths. The EM effects refer to the mass transport of metal due to the momentum transfer between conducting electrons and diffusing metal atoms. The IR drop effects and the EM effects make the performance of an IC deteriorate or even fail.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

An IC layout includes layers of patterns for manufacturing an IC chip, such as various layers of patterns for forming semiconductor components on substrates and various layers of conductive paths that connect the semiconductor components. The patterns are generated by layout engineers according to a circuit design of the IC chip, usually through the operation of a layout editing tool or an electronic design automation (EDA) tool. Each pattern corresponds to a mask pattern that is usable to form at least a feature, such as a well, a drain region, a source region, a gate electrode, a conductive line, or other features over a semiconductor substrate.

Figure 1:
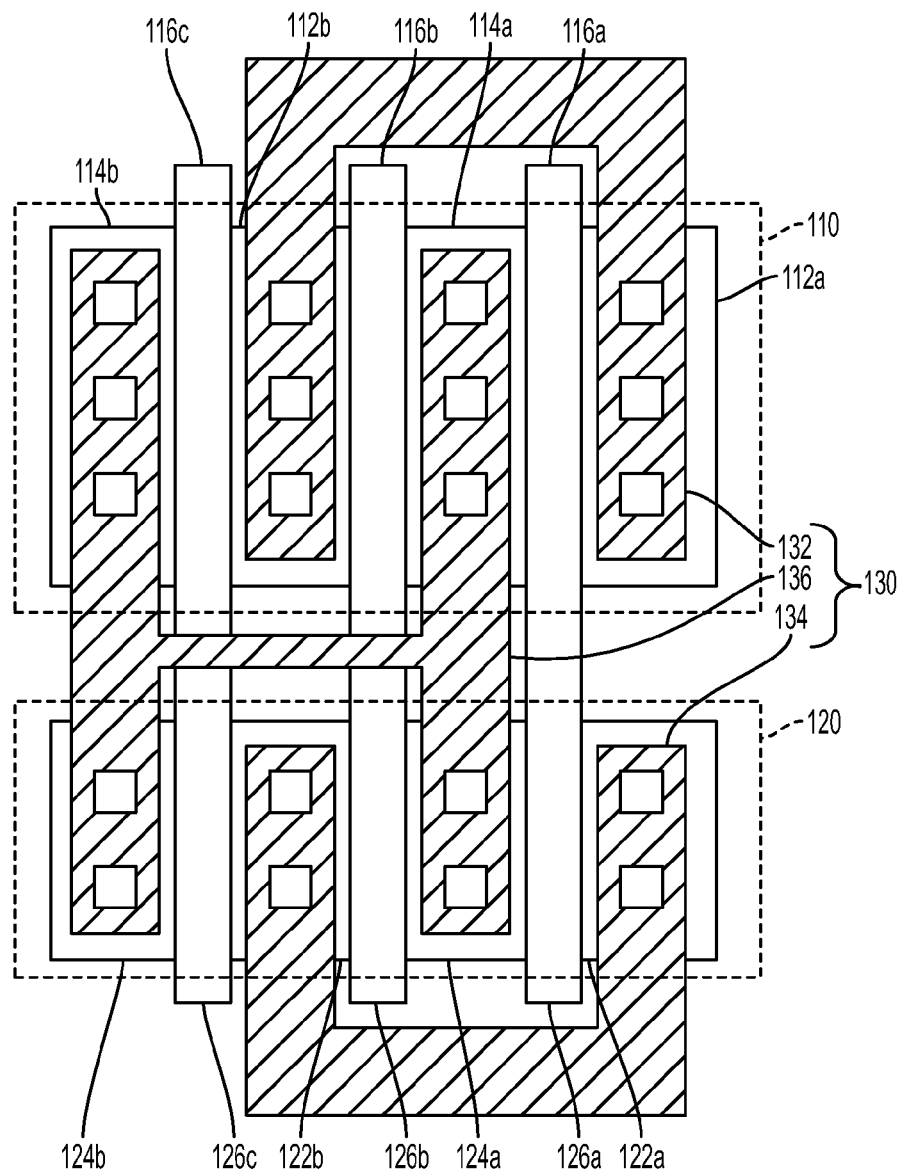
FIG. 1 is a top view of a portion of a layout of an inverter.

FIG. 1 is a top view of a portion of a layout of an inverter. Although FIG. 1 depicts patterns that are usable to form at least a portion of the inverter, these patterns will be referred to by the corresponding features they are used to form for better clarity of the description.

The inverter includes a P-type Metal-Oxide Semiconductor (PMOS) transistor 110 and an N-type Metal-Oxide Semiconductor (NMOS) transistor 120. The PMOS 110 includes a plurality of sources 112a, 112b; a plurality of drains 114a, 114b; and a plurality of gates 116a, 116b, 116c. Similarly, the NMOS 120 includes a plurality of sources 122a, 122b; a plurality of drains 124a, 124b; and a plurality of gates 126a, 126b, 126c. The gates 116a-c and 126a-c are connected together to form the inverter. Further, a plurality of patterns corresponding to conductive paths at a first metal layer 130 is depicted and overlaying one or more layers of patterns for forming the PMOS 110 and the NMOS 120. The patterns for the first metal layer 130 include patterns corresponding to a VDD power line 132, a VSS power line 134, and a conductive path 136 connecting the drains 114a, 114b, 124a, 124b of the PMOS 110 and the NMOS 120.

The partial layout depicted in FIG. 1 is used to illustrate what a layout may look like. A person of ordinary skill in the art will appreciate that, in some embodiments, a complete layout for forming a circuit based on a circuit design has more layers of patterns for forming a plurality of other electrical components and a plurality of other layers of conductive paths.

Generally, the IR drop effects and the EM effects of the IC chip are cumulative effects of both the circuit design and the physical layout. To keep the impacts of the IR drop effects within a predetermined range, a voltage drop along a signal path is set to not exceed a threshold value. For example, in a 28 nanometer (nm) high power process, the threshold value for a maximum voltage drop along a path in the power networks for power supply VDD or VSS is set to be 25 millivolts (mV).

Usually, after the layout for the circuit design is generated, a resistance-capacitance (R-C) extraction is performed to convert at least a portion of the layout, such as the signal paths in the power network for power supply VDD, into a circuit level model or a chip level model. Subsequently, a circuit level simulation or a chip level simulation is performed based on the extracted circuit level model or the extracted chip level model in order to determine if the maximum voltage drop in the power networks exceeds the predetermined threshold value. If the simulation result shows that the maximum voltage drop in the power networks exceeds the predetermined threshold value, the layout and/or the circuit design is modified in order to reduce the IR drop effects. However, chip or circuit level simulation is time consuming and resource demanding. Further, several iterations of the extraction-simulation-modification process for reducing the IR drop effects may be required to ensure complete compliance of the predetermined threshold value.

Further, to keep the impacts of the EM effects within a predetermined range, a plurality of factors of the layout, such as number of conductive layers, number of via layers, ambient temperature the circuit design is intended for, signal activities along a path, and/or minimum lifetime the circuit design is intended for, are considered. In at least one embodiment, these factors are analyzed and simplified as an average current density along a signal path being set to not exceed a threshold value. For example, in 28 nanometer (nm) high performance process, a threshold value for a maximum current along a via having a given size of 45 by 45 nm² landing on a first metal layer is set to be 36.9 µA per via. Similarly, iterations of the extraction-simulation-modification process may be necessary for ensuring compliance with the threshold value, and the iteration process for reducing EM effects is time and resource demanding.

Figure 2:
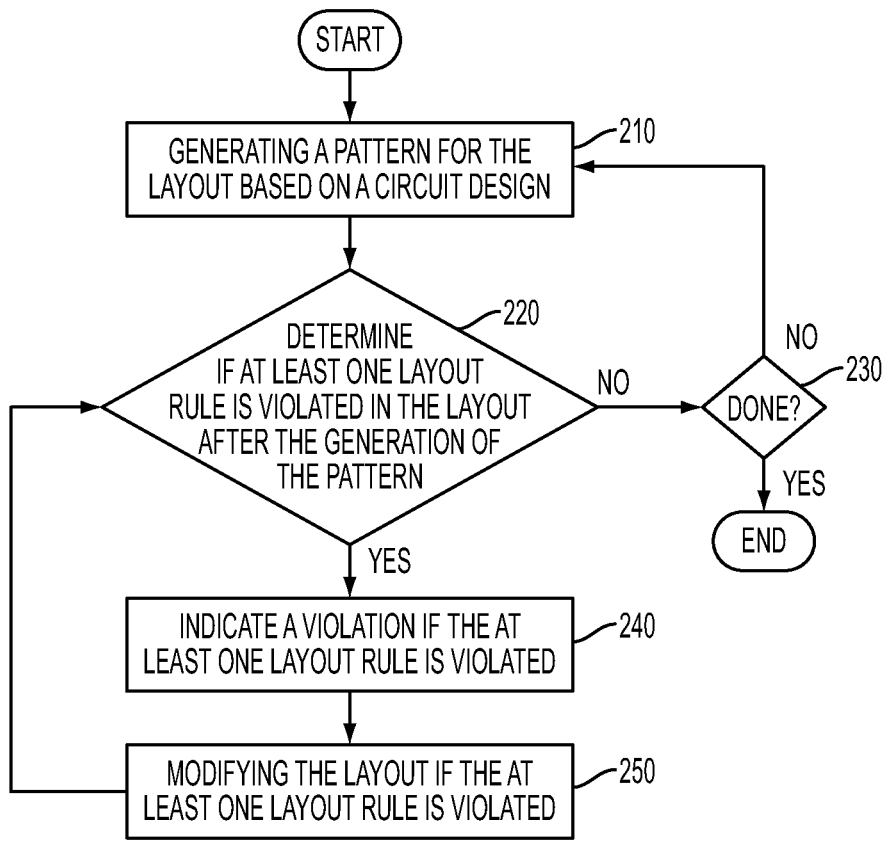
FIG. 2 is a flow chart of a method of preparing a layout according to an embodiment.

FIG. 2 is a flow chart of a method of preparing a layout according to an embodiment. The layout is prepared based upon a circuit design. A person of ordinary skill in the art will appreciate that, in some embodiments, additional operations are performed before, during, and/or after the method depicted in FIG. 2. Further, the disclosed operations may be added, replaced, changed, and/or eliminated as appropriate, in accordance with the spirit and scope of the present disclosure.

In operation 210, a pattern for the layout based on the circuit design is generated by a layout generator. In some embodiments, the layout generator is a layout editing tool that allows a layout engineer to draw the pattern for the layout or an EDA tool that automatically converts the circuit design into the layout.

After the pattern for the layout is generated, the process proceeds to operation 220 wherein a layout rule-based checker determines if at least one layout rule is violated in the layout. The at least one layout rule is specified according to a predetermined maximum value for at least one of an estimated voltage drop along a signal path in the layout or an estimated current density on the signal path. For example, in the present embodiment, the at least one layout rule has constraints that are usable to keep a maximum voltage drop along the path at or lower than 25 mV. In at least another embodiment, the at least one layout rule has constraints that are usable to keep a maximum current density along the path at or lower than a predetermined threshold value.

If the layout rule based checker determines that the pattern generated in operation 210 satisfies the layout rules, the process proceeds to operation 230 for determining if the layout is completed, i.e., if all the patterns for the layout according to the circuit design are generated and checked. If not, the process proceeds to operation 210 for adding another pattern according to the circuit design.

However, in operation 220, if it is determined that at least one layout rule is violated, the process proceeds to operation 240, wherein an indication of the violation is presented. In some embodiments, the violation of layout rules is indicated in a layout tool. The violation can be indicated by storing such violation in a computer readable storage medium, by specifically highlighting the pattern that does not pass the layout rule checking, or by display of a warning dialog box in the layout tool.

Subsequently, the process proceeds to operation 250, where the layout engineer is required to modify the layout, or the circuit engineer is asked to modify the circuit design in order to adjust the currents that cause the violation of rules or allow the layout engineer to make an even more significant change to the layout. In some embodiments, the layout is modified to conform with the layout rules. In some embodiments, a sub-circuit of the circuit design is replaced with an alternative sub-circuit that has a slower operating frequency and lower driving current than the original sub-circuit. After making the modification, the pattern or the layout is again checked in operation 220.

In some embodiments, operation 220 is performed after the entire layout is prepared. For example, after operation 210, the process proceeds to operation 230, and operation 220 is performed only after all patterns for the layout are generated. In addition, in some embodiments, the modification of the layout is performed by an automation tool.

In some embodiments, the layout rule comprises at least one constraint on a relationship between a power line pattern and a device pattern in the layout. For example, the at least one constraint comprises at least one of a minimum number of contacts per device, a minimum finger width per device, a minimum number of power vias per device, or a minimum power strap width.

Figure 3A:
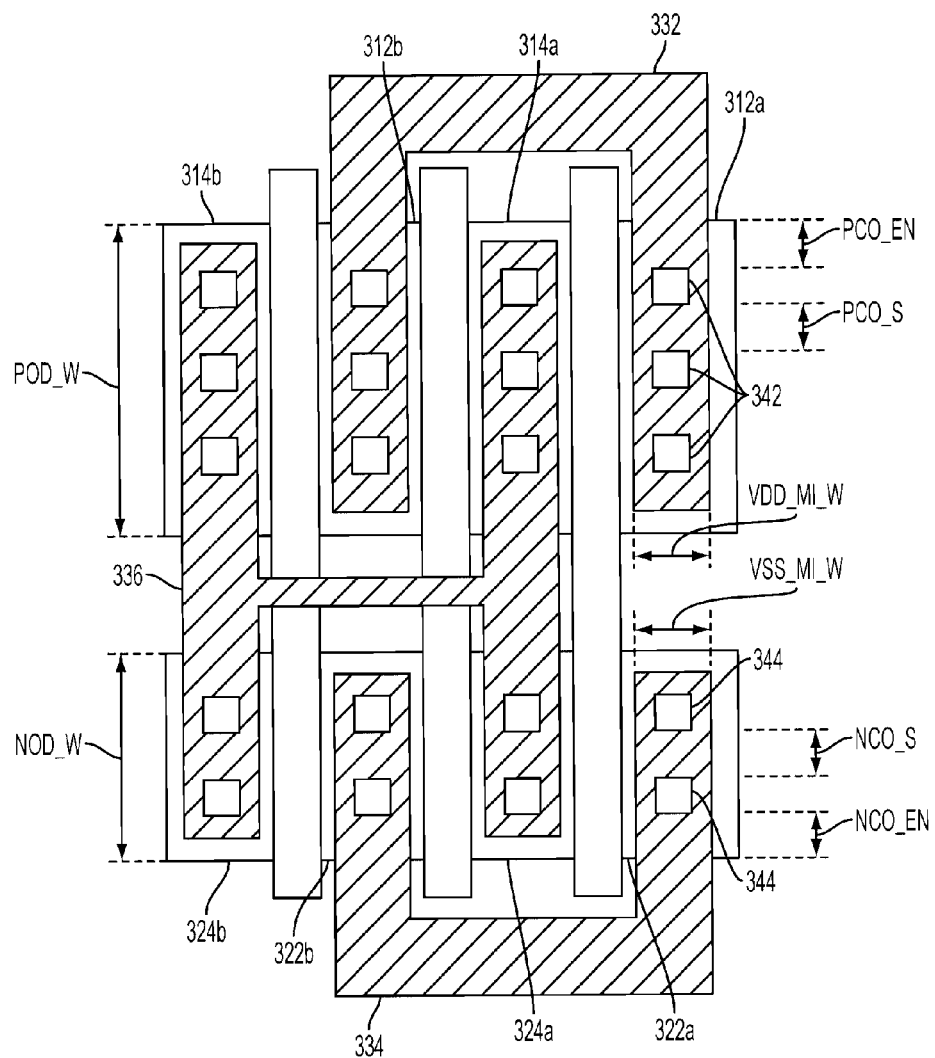
FIGS. 3A-3B are diagrams of sample layouts for illustrating layout rules with regard to a relationship between a power line pattern and a device pattern according to some embodiments.

FIG. 3A depicts a diagram of sample layouts for illustrating layout rules with regard to a relationship between a power line pattern and a device pattern according to some embodiments. Similar to the sample layout depicted in FIG. 1, FIG. 3A depicts a partial layout for forming an inverter. Although FIG. 3A depicts patterns that are usable to form at least a portion of the inverter, the patterns are referred to by the corresponding features they are used to form for better clarity of the description.

Similar to the inverter depicted in FIG. 1, the inverter depicted in FIG. 3A has a PMOS and an NMOS. The PMOS includes a plurality of sources 312a, 312b and a plurality of drains 314a, 314b. The NMOS includes a plurality of sources 322a, 322b and a plurality of drains 324a, 324b. Other features of the inverter are omitted for clarity of the disclosure. Further, a plurality of patterns corresponding to signal paths at a first metal layer is depicted and overlaying one or more layers of patterns for forming the PMOS and the NMOS. The patterns for the first metal layer include patterns corresponding to a VDD power line 332, a VSS power line 334, and a conductive path 336 connecting the drains 314a, 314b and 324a, 324b.

In the present embodiment using a 28 nm high power process, a plurality of rules regarding constraints on a relationship between a power line pattern and a device pattern in the layout are established. For example, a VDD contact rule requires the PMOS to have a minimum number of VDD contacts in a VDD contact region, such as the sources 312a and 312b. In at least one embodiment, the minimum number equals a maximum possible number of VDD contacts minus two. The maximum possible number of VDD contact refers to the maximum possible contact number according to a width of the active region POD_W, a contact spacing PCO_S, and a contact enclosure PCO_EN. Similarly, a VSS contact rule requires the NMOS to have a minimum number of VSS contacts in a VSS contact region, such as at the source 322a and 322b. In at least one embodiment, the minimum number equals a maximum possible number of VSS contacts minus one. The maximum possible number of VSS contact refers to the maximum possible contact number according to a width of the active region NOD_W, a contact spacing NCO_S, and a contact enclosure NCO_EN.

Further, in the present embodiment, an M1 finger width rule is established which regulates the finger width (VDD_M1_W) of VDD power line 332 and the finger width (VSS_M1_W) of the VSS power lines 334. For example, in at least one embodiment, if the width POD_W is equal to or less than 0.75 micrometers (µm) and the width NOD_W is equal to or less than 0.375 µm, the widths VDD_M1_W and VSS_M1_W equal 0.1 µm. Further, if the width POD_W is greater than 0.75 µm and the width NOD_W is greater than 0.375 µm, the widths VDD_M1_W and VSS_M1_W equal 0.12 µm.

Figure 3B:
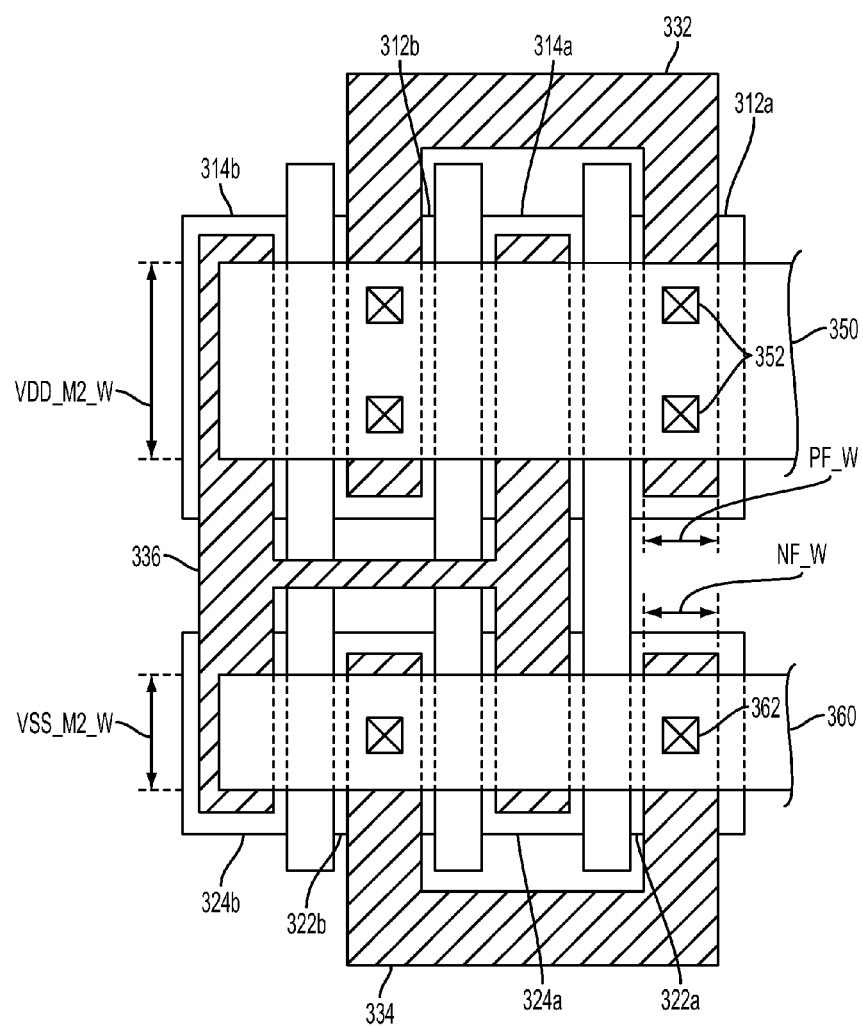

FIG. 3B depicts another diagram of sample layouts for illustrating layout rules with regard to a relationship between a power line pattern and a device pattern according to some embodiments. Although FIG. 3B depicts patterns that are usable to form at least a portion of the inverter, the patterns are referred to by the corresponding features they are used to form for better clarity of the description.

FIG. 3B depicts patterns for a VDD power line 350 and a VSS power line 360 overlaying the patterns for the components and the first metal layer as depicted in FIG. 3A. For the 28 nm high performance process example, a VIA-1 rule and a Metal-2 (M2) strap rule are established. The VIA-1 rule is directed to a minimum number of power via between the first metal layer and the second metal layer. For example, if at least one power via is about to be formed above VDD/VSS contacts, the minimum number of power via should be no less than one half of the number of VDD/VSS contacts thereunder. The M2 strap rule requires a power strap at the second metal layer to fortify the conductive fingers in the first metal layer, such as the VDD power line 332 and the VSS power lines 334, if the PMOS finger width PF_W is greater than 1 µm, the number of PMOS fingers is equal to or greater than 6, the NMOS finger width NF_W is greater than 0.5 µm, and the number of NMOS fingers is equal to or greater than 6.

In some embodiments, the at least one layout rule comprises at least one constraint on a dimension of a power line pattern in the layout or a distance between power line patterns in the layout. For example, the at least one constraint comprises at least one of a minimum width of the power line pattern, a distance of adjacent power line patterns corresponding to power lines in the same conductive layer of the integrated circuit chip, a ratio of the widths of two power line patterns at a crossover point corresponding to an interconnection node of two power lines in different conductive layers of the integrated circuit chip, or a distance of the power line pattern to an adjacent crossover point corresponding to an interconnection node of the power line and another power line of the integrated circuit chip.

Figure 4A:
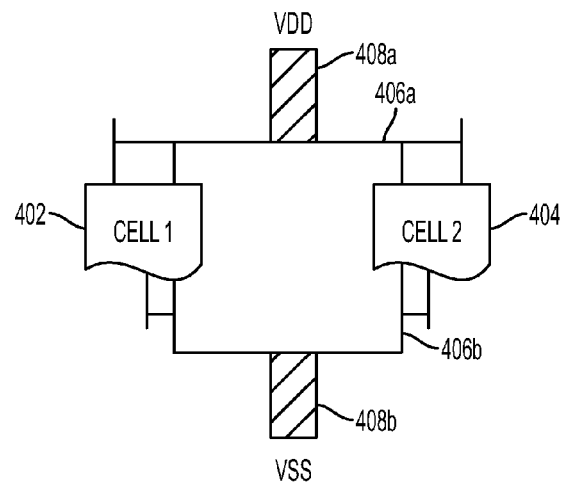
FIGS. 4A-4C are diagrams of sample layouts for illustrating layout rules with regard to power line patterns according to some embodiments.

FIG. 4A is a system diagram of a portion of a layout according to some embodiments. Similarly, patterns of the layout will be referred to by the corresponding features they are used to form for better clarity of the description.

The layout includes at least two cells: Cell 1 402 and Cell 2 404. Further, the layout includes patterns corresponding to local power lines, 406a and 406b, connecting to a power supply VDD/VSS through global power lines, 408a and 408b. In the present embodiment, the local power line is defined as a power line that is connected to one or more layout cells at the first or the second metal layer or a power line that is connected to only one cell at the third or the fourth metal layer. The global power line is defined as a power line that is connected to two or more layout cells and formed at the third or the fourth metal layer, or a metal layer over the fourth metal layer.

Figure 4B:
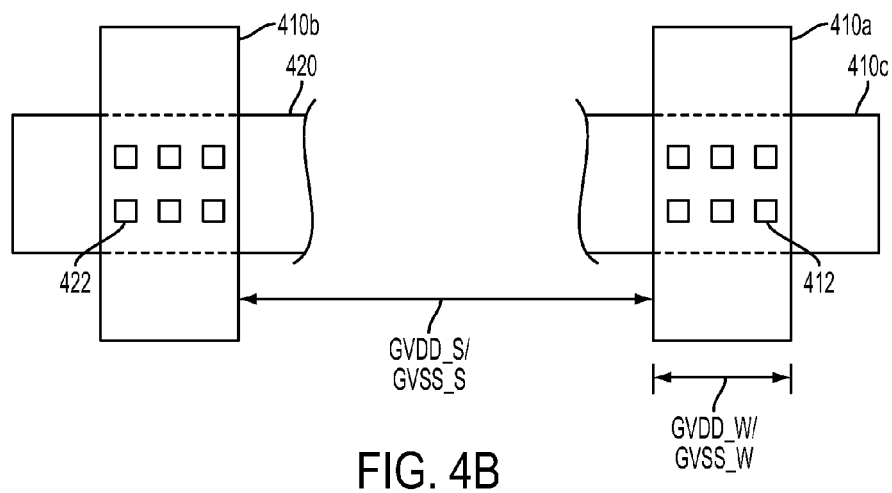

FIG. 4B is a diagram of sample layouts for illustrating layout rules with regard to power line patterns according to some embodiments. In the present embodiment, two global power lines 410a and 410b are positioned in the same metal layer, and another global power line 410c is positioned in an adjacent metal layer below the one that contains global power lines 410a and 410b. The global lines 410a and 410b are connected by a plurality of vias 412. The embodiment further has a local power line 420 having a crossover point with the global power line 410b. The global line 410b and the local power line 420 are connected by a plurality of vias 422.

In the present embodiment using a 28 nm high power process, a plurality of rules regarding constraints on a relationship between a power line pattern and a device pattern in the layout are established. In at least one embodiment, a rule is established to regulate a minimum width of a power line. For example, any global power line is required to have a width GVDD_W or GVSS_W no less than 0.6 µm. The widths of at least one global power line and another power line from an adjacent metal layer should have a ratio ranging from 0.4 to 2.5. In at least one embodiment, a rule is established to regulate a distance of adjacent power lines in the same conductive layer. For example, a distance GVDD_S or GVSS_S between global lines that are at the same metal layer should be no greater than 10 µm. In at least one embodiment, a rule is established to regulate a ratio of the widths of two power line patterns at a crossover point. For example, the crossover point of two power lines from adjacent metal layers should have a maximum possible number of via 412 or 422. The maximum possible number of via refers to a maximum possible via number according to widths of the power lines, a via spacing, and a via enclosure.

Figure 4C:
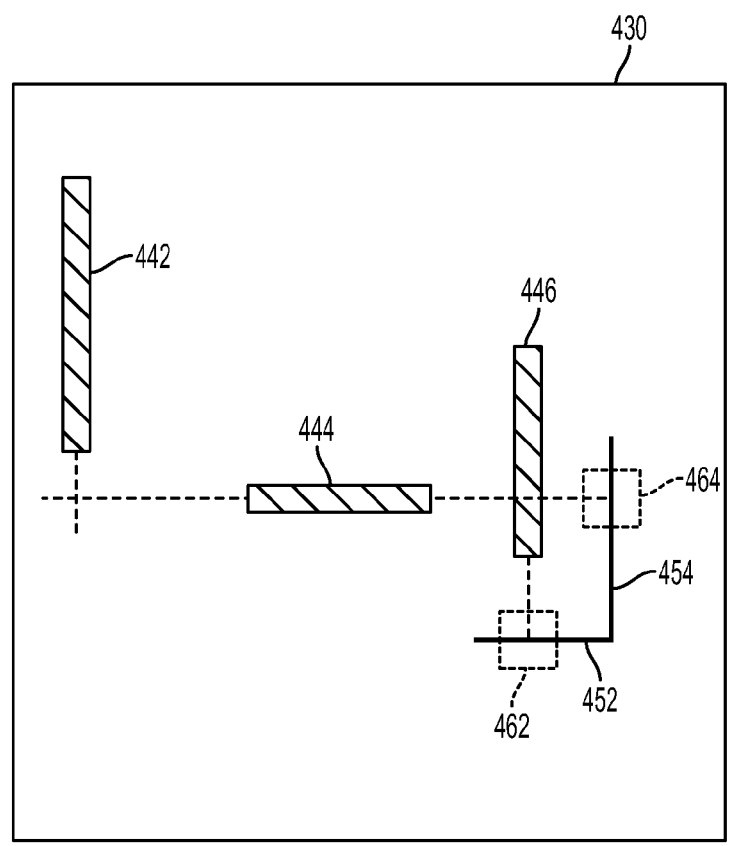

FIG. 4C is another diagram of sample layouts for illustrating layout rules with regard to power line patterns according to some embodiments. A macro cell 430 has a plurality of cells connected by a power network. The power network includes a plurality of global power lines 442, 444, 446, and a plurality of local power lines 452, 454. In the present embodiment, at least one rule is established to regulate a distance of a power line pattern to an adjacent crossover point. For example, each segment of the global power lines 442, 444, 446 should be extended to form a crossover point with another power line, or a distance of the segment of global power line 442, 444, 446 to a closest crossover point should be less than 10 µm. In addition, whenever a clearance for power vias is available at a possible crossover point of a global power line and a local power line, such as region 462 and 464, the global power line and the local power line are extended to actually form a crossover.

The embodiments disclosed in FIGS. 3A-4C are merely examples. A person of ordinary skill in the art will appreciate that more or less rules regarding constraints on relationships among power line patterns and device patterns in the layout may be used to ensure that the voltage drop or the current density along signal paths of the circuit design will not exceed a predetermined maximum value.

In the present embodiment, the layout rules includes parametric layout rules that are derived from simulation of a test-key layout. The test-key layout refers to a sample layout that comprises combinations of various dimensions of power line patterns, various dimensions of device patterns, various distances between the power line patterns, and/or various numbers of power vias between the power line patterns and the device patterns.

In the present embodiment, the layout rules also include topological layout rules that are derived from an actual integrated circuit. For example, instead of running a simulation, the layout modifications made to a layout after testing an actually manufactured integrated circuit provide guidelines for establishing layout rules regarding IR drop effects or EM effects. These topological layout rules are also usable for preventing a maximum voltage drop along a path or a maximum current density along the path from exceeding the predetermined maximum value.

Although, in the present embodiment, the layout rules are derived from simulation of a test-key layout or a prior layout modification of an actual integrated circuit, in some embodiments, the layout rules are derived only from simulation of a test-key layout or experiences from testing and fixing an actual integrated circuit.

Figure 5:
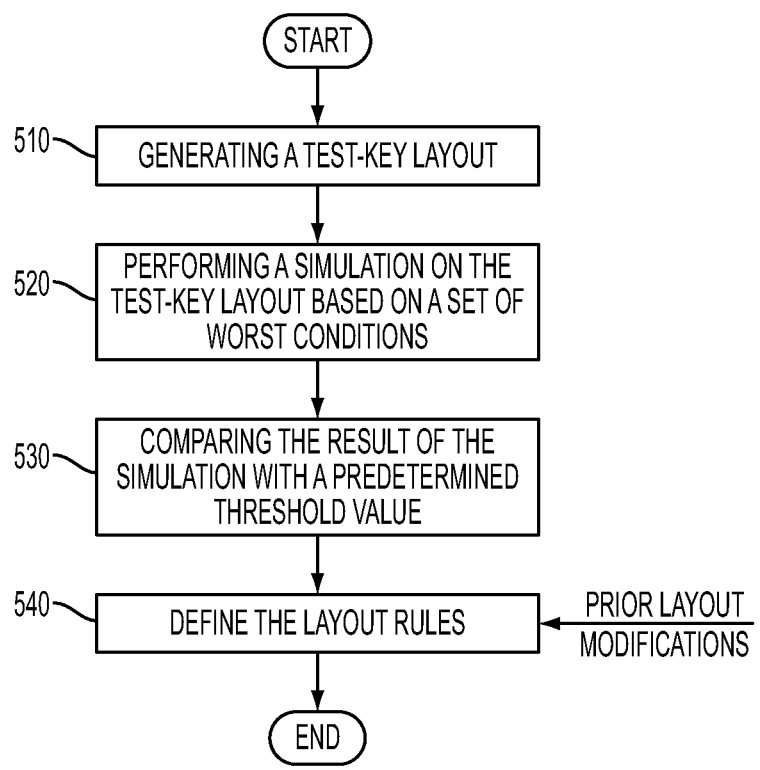
FIG. 5 is a flow chart of a method of generating a layout rule for a semiconductor manufacturing process according to an embodiment.

FIG. 5 is a flow chart of a method of generating a layout rule for a semiconductor manufacturing process according to an embodiment. A person of ordinary skill in the art will appreciate that, in some embodiments, additional operations are performed before, during, and/or after the method depicted in FIG. 5. Further, the disclosed operations may be added, replaced, changed order, and/or eliminated as appropriate, in accordance with the spirit and scope of the present disclosure.

Figure 6:
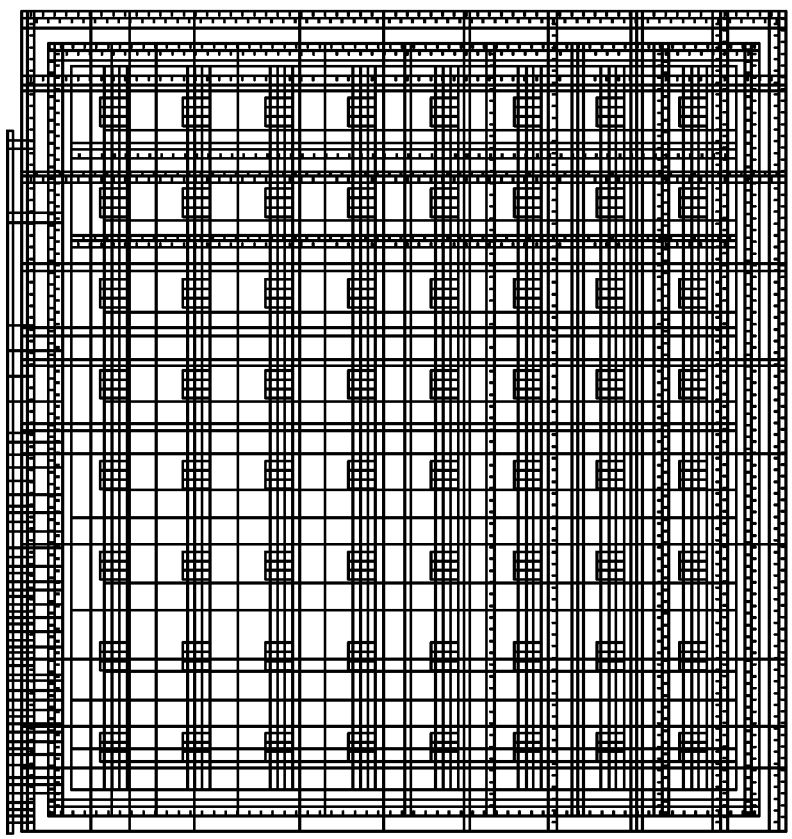
FIG. 6 is a diagram of a sample test-key layout according to an embodiment.

In operation 510, a test-key layout is generated. FIG. 6 is a diagram of a sample test-key layout according to an embodiment. The test-key layout comprises different combinations of various dimensions of power line patterns, various dimensions of device patterns, various distances between the power line patterns, or various numbers of power vias between the power line patterns and the device patterns.

Then, in operation 520, a circuit level or chip level simulation based on the test-key layout is performed in order to determine the voltage drops and the current density along different paths having different combinations of sizes. Subsequently, in operation 530, the simulation results are compared with a predetermined threshold value for a voltage drop along a signal path or a current density on the signal path. As such, in operation 540, a plurality of threshold widths and minimum number of contacts/vias are determined and used as the layout rules as illustrated in FIGS. 3A-4C. Also, in some embodiments, one or more layout rules are established according to a previous layout modification of an actual integrated circuit.

In some embodiments, the simulation is a circuit level simulation based on a set of worst case conditions for the test-key layout and the semiconductor manufacturing process. In some embodiments, the set of worst case conditions comprises a high-speed operating condition for the semiconductor manufacturing process. In some other embodiments, the set of worst case conditions comprises a predetermined operating condition that is customized based on the circuit design, performance requirements, and the manufacturing process.

Figure 7:
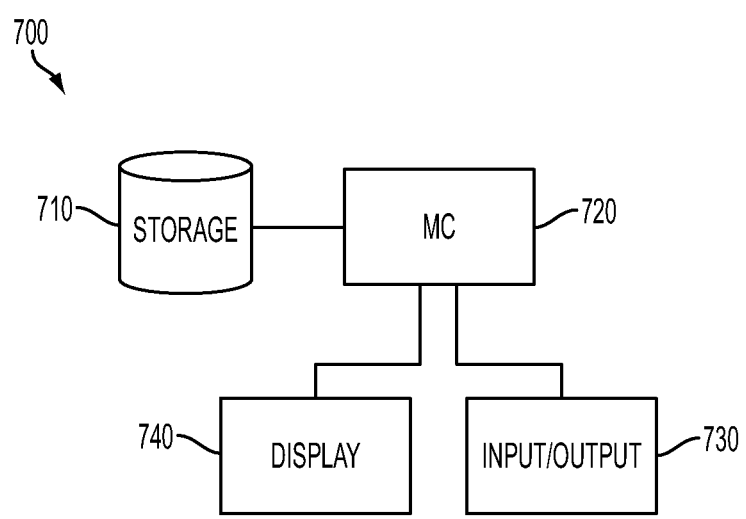
FIG. 7 is a high-level functional block diagram of a computer system according to an embodiment.

FIG. 7 is a high-level functional block diagram of a computer system 700 for implementing the method as depicted in FIG. 2 or 5 according to an embodiment. Computer system 700 includes a computer readable storage medium 710 encoded with, i.e., storing, a computer program code, i.e., a set of executable instructions. The computer system 700 includes a processor 720 electrically coupled to the computer readable storage medium 710. The processor 720 is configured to execute the computer program code encoded in the computer readable storage medium 710 in order to generate, verify, and modify a layout according to the methods as depicted in FIGS. 2 and 5.

In some embodiments, the processor 720 is a central processing unit (CPU), a multi-processor, a distributed processing system, and/or any suitable processing unit.

In some embodiments, the computer readable storage medium 710 is an electronic, magnetic, optical, electromagnetic, infrared, and/or a semiconductor system (or apparatus or device). For example, the computer readable storage medium 710 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 710 includes a compact disk-read only memory (CD-ROM), a compact disk-read/write (CD-R/W), and/or a digital video disc (DVD).

Further, the computer system includes an input/output interface 730 and a display 740. The input/output interface 730 is coupled to the processor 720 and allows a layout engineer or a circuit engineer to operate the computer system 700 in order to perform the methods depicted in FIG. 2 or FIG. 5. The display 740 displays the status of operation of the methods depicted in FIG. 2 or FIG. 5 in a real-time manner, and preferably provides a Graphical User Interface (GUI). The input/output interface 730 and the display 740 allow an operator to operate the computer system 700 in an interactive manner.

Although the present disclosure and its advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

One aspect of this disclosure relates to a method of preparing a layout for manufacturing an integrated circuit chip according to a circuit design. The method includes generating a pattern for the layout based on the circuit design, determining, by a processor, if at least one layout rule is violated by an inclusion of the generated pattern in the layout and modifying the layout if the at least one layout rule is violated. The at least one layout rule including a constraint on a relationship between a power line pattern and a device pattern in the layout. The at least one layout rule being specified by comparing a predetermined threshold value with at least one of an estimated voltage drop along a signal path in a second layout different than the layout or an estimated current density on the signal path in the second layout. The constraint includes a minimum number of contacts per device or a minimum number of power vias per device.

Another aspect of this description relates to a system. The system including a computer readable storage medium for storing a computer program code, and a processor coupled to the computer readable storage medium. The processor being configured to execute the computer program code. The code being arranged to cause the processor to generate a layout pattern for a circuit design, check if at least one layout rule is violated after the generation of the layout pattern and modify the layout in response to a violation of the at least one layout. The at least one layout rule including a constraint on a relationship between a power line pattern and a device pattern in the generated layout pattern. The at least one layout rule being established by comparing a predetermined threshold value with an estimated voltage drop along a signal path in a second layout different from the layout or an estimated current density on the signal path in the second layout. The constraint includes a minimum number of contacts per device or a minimum number of power vias per device.

Still another aspect of this description relates to a non-transitory computer readable storage medium for storing a computer program code which when executed by a processor causes the processor to perform a method. The method includes generating at least a portion of a layout for a circuit design, determining if at least one layout rule is violated by the layout and modifying the layout if the at least one layout rule is violated. The at least one layout rule including a constraint on a relationship between a power line pattern and a device pattern in one or more layout patterns of the layout. The at least one layout rule being established by comparing a predetermined threshold value with an estimated voltage drop along a signal path in a second layout different from the layout or an estimated current density on the signal path in the second layout. The constraint includes a minimum number of contacts per device, a minimum number of power vias per device, and a minimum power strap width.

What is claimed is:

1. A method of preparing a layout for manufacturing an integrated circuit chip according to a circuit design, the method comprising:
generating a pattern for the layout based on the circuit design;
determining, by a processor, if at least one layout rule is violated by an inclusion of the generated pattern in the layout, the at least one layout rule comprising a constraint on a relationship between a power line pattern and a device pattern in the layout, and the at least one layout rule being specified by comparing a predetermined threshold value with at least one of an estimated voltage drop along a signal path in a second layout different than the layout or an estimated current density on the signal path in the second layout, wherein the constraint comprises a minimum number of contacts per device or a minimum number of power vias per device; and
modifying the layout if the at least one layout rule is violated.

2. The method of claim 1, wherein the step of determining if the at least one layout rule is violated by the inclusion of the generated pattern in the layout comprises deriving the at least one layout rule from simulation of the second layout.

3. The method of claim 1, wherein the step of determining if the at least one layout rule is violated by the inclusion of the generated pattern in the layout comprises deriving the at least one layout rule based on the second layout being a sample electronic layout.

4. The method of claim 1, further comprising generating another pattern for the layout based on the circuit design, wherein the determination of the violation is performed before generating the another pattern.

5. The method of claim 1, wherein the step of determining if the at least one layout rule is violated by the inclusion of the generated pattern in the layout comprises determining if the at least one layout rule is violated based on the second layout being a test-key layout.

6. The method of claim 1, wherein the step of determining if the at least one layout rule is violated by the inclusion of the generated pattern in the layout comprises determining if the at least one layout rule is violated based on the at least one layout rule comprising a parametric layout rule derived from simulation of a test-key layout.

7. The method of claim 1, wherein the step of determining if the at least one layout rule is violated by the inclusion of the generated pattern in the layout comprises determining if the at least one layout rule is violated based on the second layout being a prior layout modification for an actual integrated circuit.

8. The method of claim 1, wherein the step of determining if the at least one layout rule is violated by the inclusion of the generated pattern in the layout comprises determining if the at least one layout rule is violated based on the at least one layout rule comprising a topological layout rule derived from a prior layout modification.

9. A system comprising:
a computer readable storage medium for storing a computer program code; and
a processor coupled to the computer readable storage medium, the processor being configured to execute the computer program code, the code being arranged to cause the processor to:
generate a layout pattern for a circuit design;
check if at least one layout rule is violated after the generation of the layout pattern, the at least one layout rule comprising a constraint on a relationship between a power line pattern and a device pattern in the generated layout pattern, and the at least one layout rule being established by comparing a predetermined threshold value with an estimated voltage drop along a signal path in a second layout different from the layout or an estimated current density on the signal path in the second layout, wherein the constraint comprises a minimum number of contacts per device or a minimum number of power vias per device; and
modify the layout in response to a violation of the at least one layout.

10. The system of claim 9, wherein the code is further arranged to cause the processor to generate another layout pattern based on the circuit design.

11. The system of claim 9, wherein the code arranged to cause the processor to check if the at least one layout rule is violated comprises to check if the at least one layout rule is violated based on the at least one layout rule having at least one constraint regarding (a) a dimension of the power line pattern in the layout; (b) a distance between power line patterns in the layout; or (c) a relationship between the power line pattern and a device pattern in the layout.

12. The system of claim 11, wherein the code arranged to cause the processor to check if the at least one layout rule is violated comprises to check if the at least one layout rule is violated based on the at least one constraint having at least one of a minimum width of the power line pattern, a distance of adjacent power line patterns corresponding to power lines in a same conductive layer of an integrated circuit chip, a ratio of widths of two power line patterns at a crossover point corresponding to an interconnection node of two power lines in different conductive layers of the integrated circuit chip, or a distance of the power line pattern to an adjacent crossover point corresponding to an interconnection node of the power line and another power line of the integrated circuit chip.

13. The system of claim 9, wherein the code arranged to cause the processor to check if the at least one layout rule is violated comprises to check if the at least one layout rule is violated based on the at least one constraint having a minimum finger width per device width or a minimum power strap width.

14. The system of claim 9, wherein the code arranged to cause the processor to check if the at least one layout rule is violated comprises to derive the at least one layout rule from a prior layout modification of an actual integrated circuit or simulation of a test-key layout.

15. A non-transitory computer readable storage medium for storing a computer program code which when executed by a processor causes the processor to perform a method comprising:
generating at least a portion of a layout for a circuit design;
determining if at least one layout rule is violated by the layout, the at least one layout rule comprising a constraint on a relationship between a power line pattern and a device pattern in one or more layout patterns of the layout, and the at least one layout rule being established by comparing a predetermined threshold value with an estimated voltage drop along a signal path in a second layout different from the layout or an estimated current density on the signal path in the second layout, wherein the constraint comprises a minimum number of contacts per device, a minimum number of power vias per device, and a minimum power strap width; and modifying the layout if the at least one layout rule is violated.

16. The computer readable storage medium of claim 15, wherein the code is arranged to cause the processor to perform the method further comprising generating another layout pattern based on the circuit design, and the determining of a violation is performed before the generation of the another layout pattern.

17. The computer readable storage medium of claim 15, wherein the code is arranged to cause the processor to perform the step of determining if the at least one layout rule is violated comprises checking if the at least one layout rule is violated based on the at least one layout rule having at least one constraint regarding (a) a dimension of the power line pattern in the layout; (b) a distance between power line patterns in the layout; or (c) a relationship between the power line pattern and a device pattern in the layout.

18. The computer readable storage medium of claim 17, wherein the code is arranged to cause the processor to perform the step of determining if the at least one layout rule is violated comprises determining if the at least one layout rule is violated based on the at least one constraint having at least one of a minimum width of the power line pattern, a distance of adjacent power line patterns corresponding to power lines in a same conductive layer of an integrated circuit chip, a ratio of widths of two power line patterns at a crossover point corresponding to an interconnection node of two power lines in different conductive layers of the integrated circuit chip, or a distance of the power line pattern to an adjacent crossover point corresponding to an interconnection node of the power line and another power line of the integrated circuit chip.

19. The computer readable storage medium of claim 15, wherein the code is arranged to cause the processor to perform the step of determining if the at least one layout rule is violated comprises determining if the at least one layout rule is violated based on the at least one constraint having a minimum finger width per device width or a minimum power strap width.

20. The computer readable storage medium of claim 15, wherein the code is arranged to cause the processor to perform the step of determining if the at least one layout rule is violated comprises deriving the at least one layout rule from a prior layout modification of an actual integrated circuit or simulation of a test-key layout.

* * * * *